(12) United States Patent
Weaver et al.

(10) Patent No.: US 7,530,004 B1
(45) Date of Patent: May 5, 2009

(54) ERROR CORRECTION APPARATUS USING FORWARD AND REVERSE THRESHOLD FUNCTIONS

(75) Inventors: Charles Sinclair Weaver, Palo Alto, CA (US); Constance Dell Chittenden, San Carlos, CA (US); A. Brit Conner, Sunnyvale, CA (US)

(73) Assignee: Neural Systems Corp., Palo Alto, CA (US)

( * ) Notice: Subject to any disclaimer, the term of this patent is extended or adjusted under 35 U.S.C. 154(b) by 588 days.

(21) Appl. No.: 11/406,653

(22) Filed: Apr. 19, 2006

Related U.S. Application Data

(60) Provisional application No. 60/673,630, filed on Apr. 21, 2005.

(51) Int. Cl.
*G11C 29/00* (2006.01)

(52) U.S. Cl. ............... 714/760; 714/797; 714/788; 714/762; 370/201; 375/229; 375/233; 375/231; 375/316; 375/295; 375/324

(58) Field of Classification Search .......... 714/760, 714/797, 788, 762; 375/229, 233, 231, 316, 375/295, 324; 370/201
See application file for complete search history.

(56) References Cited

U.S. PATENT DOCUMENTS

| | | | |
|---|---|---|---|
| 5,050,186 A | 9/1991 | Gurcan et al. | |
| 5,268,908 A | 12/1993 | Glover et al. | |
| 5,982,741 A * | 11/1999 | Ethier | ............. 370/201 |
| 6,269,116 B1 | 7/2001 | Javerbring et al. | |
| 6,493,398 B1 * | 12/2002 | Erisman | ............. 375/295 |
| 6,608,862 B1 | 8/2003 | Zangi et al. | |
| 6,751,771 B2 | 6/2004 | Chuang et al. | |
| 7,006,563 B2 | 2/2006 | Allpress et al. | |

* cited by examiner

*Primary Examiner*—Guy J Lamarre
(74) *Attorney, Agent, or Firm*—File-EE-Patents.com; Jay A. Chesavage

(57) ABSTRACT

An error detection and correction apparatus includes three threshold logic units which make decisions based on current and previous bit values in a bit stream of block-coded data. One of the threshold logic units decodes the data stream based on an advancing time stream of data. Another threshold logic unit decodes the data stream based on a time-reversed stream of data, and the last threshold logic unit decodes the data stream based on a time-reversed input stream of data and a time-reversed set of decisions made by the first threshold logic unit. Each threshold logic unit generates decisions and a parity check of those decisions Error identification information is compared between the three streams of decisions and parity checks on those decisions, thereby producing error information, which is processed by a circuit which determines which is the most likely data transmitted.

18 Claims, 11 Drawing Sheets

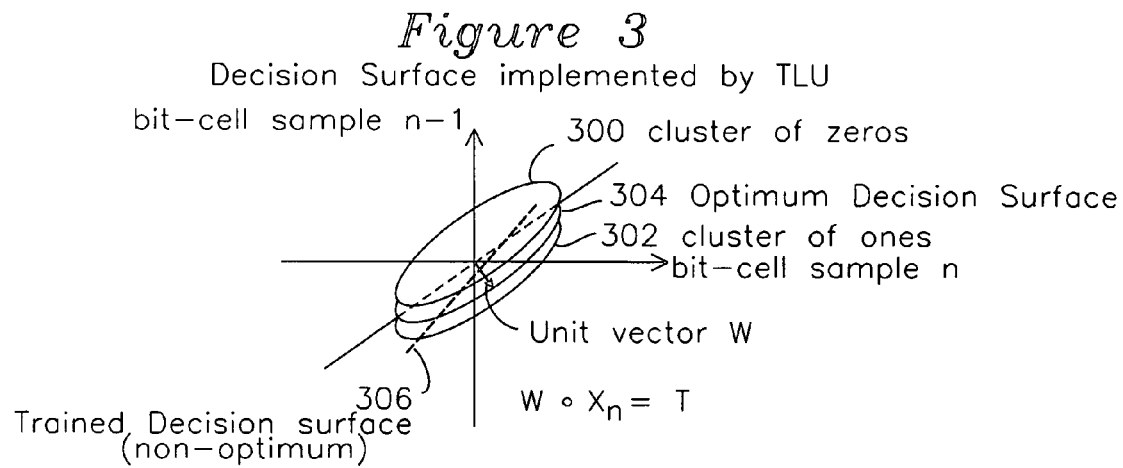
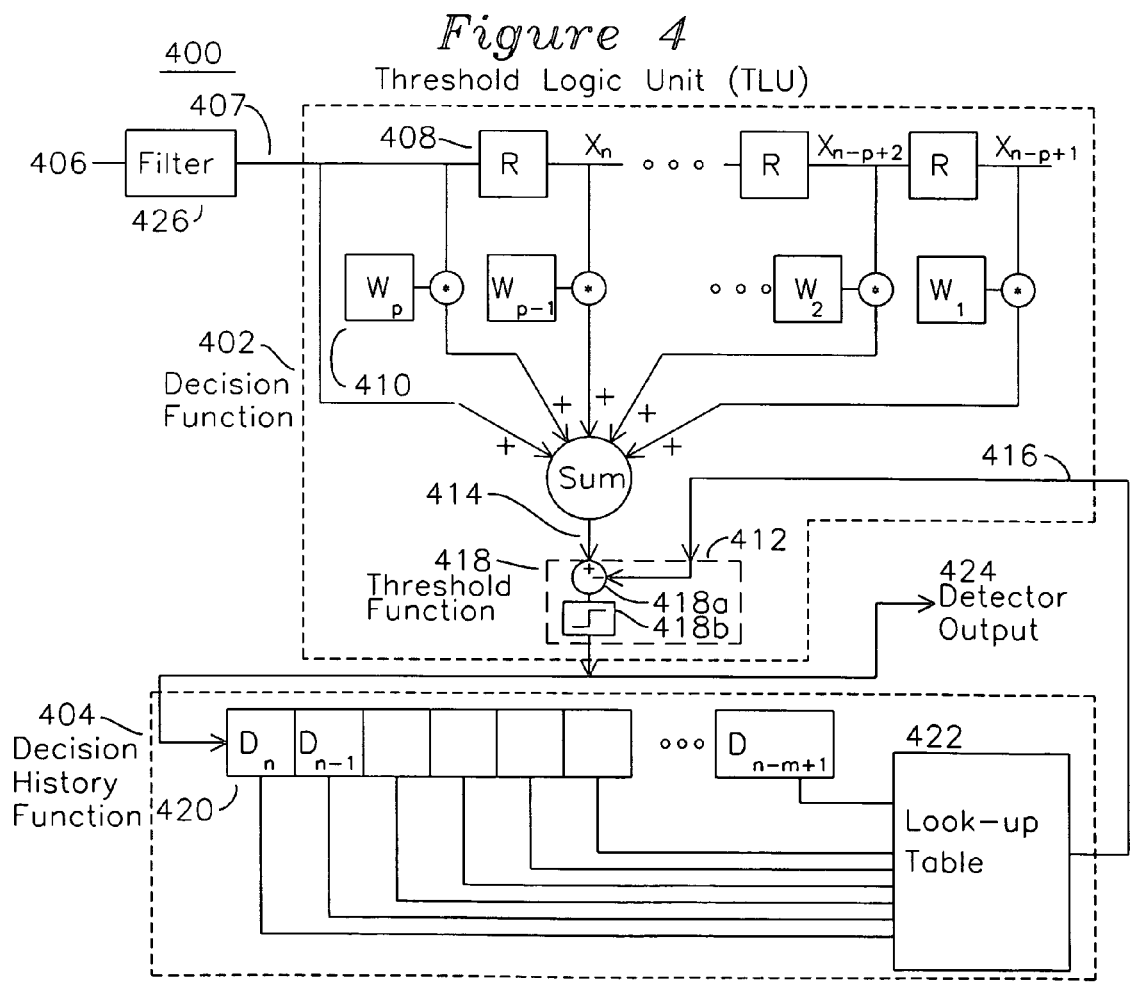

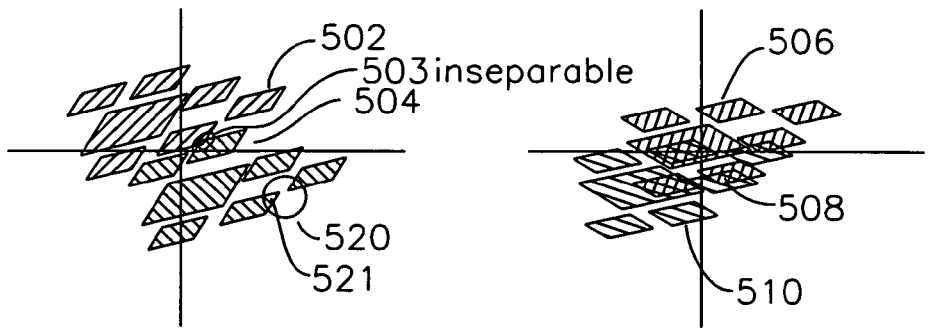
*Figure 5A*     *Figure 6A*
(not conditioned on previous bits)
Mostly Separable scatterplot    inseparable scatterplot
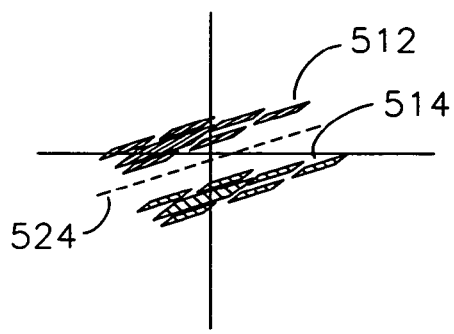 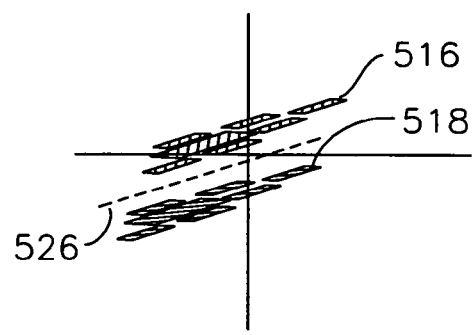
*Figure 5B*     *Figure 6B*
(conditioned on previous bits)
Separable scatterplot    Previously inseparable scatterplot
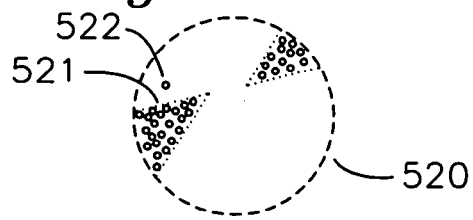
*Figure 5c*

Digital Communications System

Digital Communications System Waveforms

Forward/Reverse TLU ECC

Forward/Reverse TLU ECC

Forward/Reverse TLU ECC

Forward/Reverse TLU ECC

Forward/Reverse TLU ECC

ERROR CORRECTION APPARATUS USING FORWARD AND REVERSE THRESHOLD FUNCTIONS

This application claims the benefit of U.S. Provisional Application No. 60/673,630 filed Apr. 21, 2005.

FIELD OF THE INVENTION

The present application relates to the field of error correction, particularly error correction in the presence of intersymbol interference (ISI).

BACKGROUND OF THE INVENTION

In 1948 C. Shannon, the founder of Information Theory, published a paper that showed that no more than $$C = W \log 2 (1+SNR)$$

bits could be transmitted over a digital communications channel without error, where C is called the channel capacity in bits/sec/Hz, W is the channel bandwidth in Hz, and SNR is the signal-to-noise-power ratio. He also proved that codes existed that allowed rates arbitrarily close to C with arbitrarily small error rates.

He did not show how to construct these codes, and none were discovered until Berrou et al. invented turbo codes (C. Berrou, A. Glavieus and P. Thitmayshima, "Near Shannon Limit Error-Correcting Coding and Decoding: Turbo Codes," Proc. Of 1993 International Conference on Communications, pp. 1064-1070, 1993) that have rates close to C at low SNRs (e.g., 3 db) but not at high SNRs of 15 to 30 db. Turbo codes are now widely used where reliable communication at low SNRs such as NASA deep space channels is required.

Computer hard disk drives are binary channels that typically have strong intersymbol interference (ISI) as a consequence of recording information at as high a density as is possible, and the resulting ISI is countered with Viterbi detectors, as first described in "Error Bounds for Convolutional Codes and an Asymptotically Optimum Decoding Algorithm," published in IEEE Transactions on Information Theory, Volume IT-13, pages 260-269, in April, 1967. Error correction that is internal to the Viterbi detector has been investigated by several commercial vendors. Strong parity checks or block code decoders such as Reed-Solomon decoders external to the detector are generally used.

PRIOR ART

U.S. Pat. No. 6,751,771 by Chuang et al describes the processing of serial data from a storage device whereby the data is stored and processed using an inner and outer code correction with Reed-Solomon decoding.

U.S. Pat. No. 5,268,908 by Grover et al describes an error correction system where the data is overlaid into multiple blocks and separately processed.

U.S. Pat. No. 6,269,116 by Javerbring et al describes a demodulation system whereby a set of data symbols is demodulated in a time-forward and a time-reversed direction.

U.S. Pat. No. 7,006,563 by Allpress et al describes an equalizer which compensates for ISI by equalizing the channel using samples stored and thereafter filtered in a time-forward and time-reversed manner.

U.S. Pat. No. 5,050,186 by Gurcan et al describes an ISI equalizer using decision feedback whereby signal equalization is performed using a time-forward and time-reversed FIR filter configuration with coefficients calculated separately for each filter.

U.S. Pat. No. 6,608,862 by Zangi et al describes an algorithm for computing coefficients for a time-forward and time-reversed filter.

OBJECTS OF THE INVENTION

A first object of this invention is an error detection and correction apparatus for achieving near Shannon channel capacity (SCC) with small bit error ratios (BER) at SNRs greater than 15 db. The coding and decoding implementation typically will be less complicated than the implementation for a prior art turbo code.

A second object of the invention is a threshold logic unit (TLU) for use in improving a decision surface.

A third object of the invention is an arrangement of a forward threshold logic unit and two backward threshold logic units for error detection and correction.

A fourth object of the invention is a parity apparatus for use with a forward threshold logic unit and two backward threshold logic units for error detection and correction.

SUMMARY OF THE INVENTION

When many bits/sec/Hz are transmitted through a channel, a limiting factor is the amount of intersymbol interference (ISI) that can be tolerated by a conventional detector. For a given input sequence of 1s and 0s, the output of a specified channel with ISI due to the signal will always be the same. A pattern recognizer can be trained to recognize which input bit sequence resulted in any given ISI corrupted waveform. This sequence is the detected output.

One pattern recognizer type that can be used in this invention is a Threshold Logic Unit (TLU), which implements a linear decision surface. The threshold is a function of the previous detector outputs. It can be shown that this detector is near optimum for a channel with ISI.

Other types of pattern recognizers can be used, and the descriptions of the TLU in the present patent are not meant to imply that the practice of the invention is restricted to TLU pattern recognizers. Prior art Nearest Neighbor recognizers and the trainable digital logic recognizers that are described in U.S. Pat. No. 5,263,124 are suitable, but the invention is not restricted to these types. A fundamental element of this invention is the use of pattern recognition to identify the input bit sequence from the ISI signal channel output waveform.

During error correction, a block of incoming signal and noise samples is first processed through a "forward" TLU detector in the forward (in time) direction while a buffered copy of the input signal is processed in the reverse direction through two "reverse" TLU detectors. Forward and reverse detector errors rarely occur at the same sample, and the forward and reverse TLUs exploit this characteristic, thereby allowing a simple and accurate method to determine when an error has occurred. A small number of parity check bits helps to determine in which direction the error has occurred. Boolean logic is used to compare the forward and reverse detector outputs to correct the errors. The result is a detection system with a low BER in computer simulations where the bit rate is near the Shannon Channel Capacity (SCC) at high SNR.

The invention can also be used with conventional external error correction and is applicable to both hard disk drives and BPSK and QPSK communication channels.

TLUs have been used in pattern recognition for over 40 years. Their use in this invention is similar to decision directed feedback. However, significantly better detector BER is obtained by a new training algorithm.

BRIEF DESCRIPTION OF THE DRAWINGS

FIG. 3 shows a schematic diagram of a decision surface implemented by a TLU.

FIG. 4 shows a block diagram of a TLU in a decision-directed feedback system, where the threshold is a function of the previous detector outputs.

FIGS. 5A and 6A show separable scatterplots of a current bit (bit n) vs a previous bit (bit n−1) and current bit vs the next bit (n+1), respectively.

FIGS. 5B and 6B show the scatterplots of bit n vs bit n−1, and bit n vs bit N+1, respectively, when the samples are conditioned on the previous detector outputs; e.g., if the previous outputs were 10010 then only samples that followed those previous samples would be plotted. A TLU-implemented linear surface can separate the 0 and 1 clusters.

FIG. 5C shows a detail view of the data points within the clusters of FIG. 5A.

DETAILED DESCRIPTION OF THE INVENTION

Figure 1:
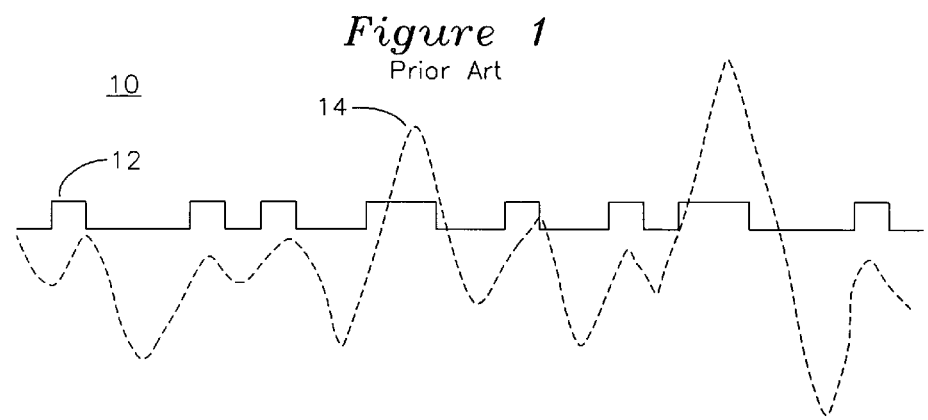
FIG. 1 shows the waveform for a channel with strong Inter Symbol Interference (ISI).

When a non-return to zero (NRZ) binary signal 12 is transmitted in a communications channel at rates sufficient to cause ISI, the individual 1s and 0s can become so distorted that they become undistinguishable, as shown in the analog waveform 14 in FIG. 1. In a linear channel, or more generally in one where the channel transfer function has an inverse transfer function, a given series of 1s and 0s without noise will always result in the same channel output waveform. A pattern recognizer can be used to associate a waveform with the input bit sequence. The advantage of this technique is that there is no requirement to limit the bit rate to values that do not cause ISI.

Figure 2:
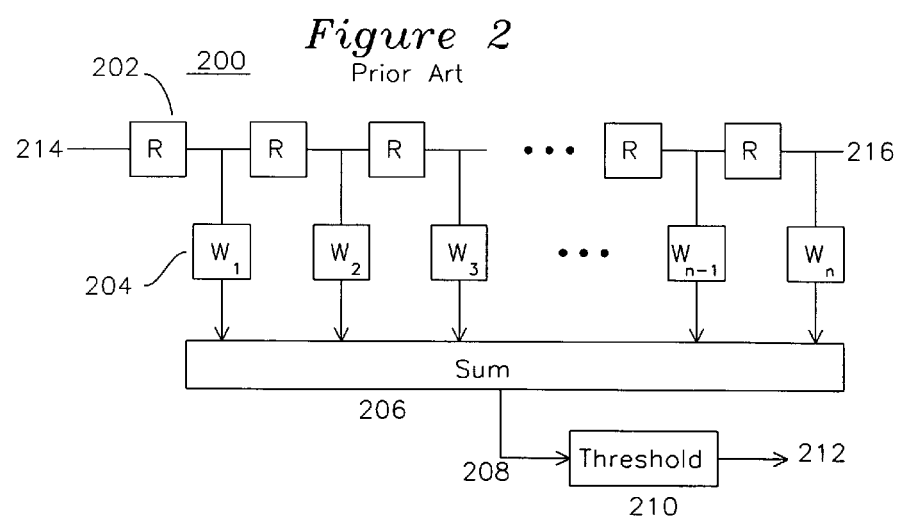
FIG. 2 shows the block diagram of a TLU.

FIG. 2 shows the block diagram of a prior art Threshold Logic Unit (TLU) 200, which has the topology of a Finite Impulse Response (FIR) filter. The TLU 200 receives a digitized input signal 214, stores the values in a series of registers 202 that may be clocked at the sample rate of the incoming signal 214, and the intermediate register 202 values are multiplied by a series of weights W1 . . . Wn, and these products are delivered to a summer 206 which generates a value 206 that is passed to a threshold unit 210. The Threshold unit 210 does a comparison to decode the resulting value into a 1 or a 0. This device has been used to recognize patterns since the 1960s. Mathematically, the incoming set of samples 214 at time n of a waveform $x_n$ distorted by ISI is entered in sequence at the input with a time of one bit interval between samples. Each sample is multiplied by the corresponding weight $w_n$ and the products are summed. The summation is $$y_n = \sum_{i=0}^{m-1} x_{n-i} w_{i+1}$$

$y_n$ is the dot product of the vectors $X_n$ and $W$ where $$X_n = \begin{bmatrix} x_n \\ x_{n-1} \\ \vdots \\ x_{n-m+1} \end{bmatrix} \text{ and } W = [\, w_1 \quad w_2 \quad \ldots \quad w_m \,].$$

The elements of $X_n$ are the $n^{th}$ sample of the waveform, $x_n$, and the previous m−1 samples.

Then $$y_n = W \cdot X_n.$$

If $y_n \geq T$ then the threshold 210 output 212 is 1; otherwise it is 0.

The equation for $y_n$ is a plane 304, as is shown in FIG. 3. When W is normalized to a unit length, the plane 304 is perpendicular to a vector that passes through the origin, and the distance from the plane to the origin is T, which defines the optimum decision surface 304. In this example, if $X_n$ is above the decision surface 304 (a two-dimensional plane), the threshold output is 0. Below the plane it is 1. Also in this example, the $X_n$ are grouped into two clusters; the upper cluster 300 contains the $X_n$ that occurs when the $n^{th}$ input bit is a 0, and the lower cluster 302 contains the $X_n$ that occurs when the $n^{th}$ input bit is a 1. When $X_n$ is above the optimum decision surface 304 the output and classification is 0. During the training phase, a typical set of $X_n$ is obtained from training waveforms and stored. This is called the training set, and results in the non-optimum trained decision surface 304 shown only as a dashed line for clarity.

The following standard training algorithm commonly is used to adjust the weights and T so that the plane 304 is between the clusters 300 and 302. The vectors $X_n$ are made up from the training set (recall that the first element of $X_n$ is the sample $x_n$ and the rest of the elements are the previous m samples) and are entered into the algorithm. $W_n$ and $T_n$ are the $n^{th}$ weight and threshold values, respectively, and the category of $X_n$ is the value of the $n^{th}$ input bit.

The weights are adjusted as follows:

If $W_n \cdot X_n \geq T_n$ and the category is 0 then $$W_{n+1} = W_n + \delta X_n$$

$$T_{n+1} = T_n - \delta$$

If $W_n \cdot X_n < T_n$ and the category is 1 then $$W_{n+1} = W_n - \delta X_n$$

$$T_{n+1} = T_n + \delta, \text{ where } 0 < \delta < 2$$

If $W_n \cdot X_n \geq T_n$ and the category is 1, or

If $W_n \cdot X_n < T_n$ and the category is 0, then $$W_{n+1} = W_n$$

$$T_{n+1} = T_n.$$

This algorithm guarantees that the plane 304 will be placed between non-overlapping clusters in a finite number of steps.

When the plane 304 is between the clusters no more errors are made, and therefore the adjustments cease. The plane usually will be in a non-optimum position 306 as shown in FIG. 3. In this example, the dashed line 306 is close to both clusters, and therefore a small perturbation (e.g., due to noise) in the signals during actual operations will cause $X_n$ to fall on the wrong side of the plane. If the plane can be placed in an optimum position 304, the plane will be further from both clusters so that there is less likelihood that noise will force $X_n$ to fall on the incorrect side of the plane. The algorithm to optimize the position is part of the invention and is accomplished in the steps described below:

1) Trim any vectors from the clusters where the vectors are determined to cause the clusters to be too close to each other or to overlap.

2) Translate the $X_n$ vector coordinates by subtracting the mean value $\overline{X}$ of all vectors in the current training set.

This results in a simplified process where the threshold starts out and remains zero, and only the weights need to be adapted, producing a modified version of the training rule (and subsequently of the classification rule). Wherever $X_n$ appears in the equations, it is substituted with $(X_n-\overline{X})$, and all thresholds are zero. Thus, the equation $y_n = W \cdot X_n$ becomes $y_n = W \cdot (X_n - \overline{Y})$ and all T's in the tests become 0.

3) Adapt the TLU weights W according to the equations above.

4) If the weights don't converge, i.e., if after a reasonable amount of adaptation processing, errors continue to occur when testing the weights with the training set, remove the vectors that cause the errors, and repeat the adaptation with the diminished training vector set.

5) Once the weights have converged, convert the TLU support vector W to a unit vector.

6) Adjust each dimension of the unit vector until optimum separation between clusters is achieved. To do this, apply a small incremental amount 6 as follows:
   1. Each dimension $u_i$ of the unit vector is sequentially incremented by $\delta u_i$ until the new surface intersects a cluster in that dimension. (To determine whether the intersection point has been crossed, test $W_n \cdot X_n$ to determine whether the result is a 1 or a 0. If the result is different from the original state, the intersection point has been crossed.)
   2. Change the direction of rotation by negating $\delta$, dividing $\delta$ by 2, and continue incrementing for one or more steps, where $\delta$ is divided by 2 at each step. Continue until tests show that the resultant surface no longer intersects a cluster.
   3. Continue repeating 2 until the vector crosses the cluster intersection again, changing direction each time the point of intersection is crossed; this changes the vector in smaller and smaller steps, honing in to the point where the surface is very close to intersecting with the cluster.
   4. Stop when $\delta$ becomes small enough to cause a negligible difference.

7) Once all dimensions have been adapted as above, save the final result as $D_{max}$.

8) Repeat the above orthogonal vector process, starting again with the original TLU vectors and changing the sign of the original $\delta$. Save the final TLU vector as $D_{min}$.

9) Take the mean of $D_{max}$ and $D_{min}$ as the adjusted optimal TLU.

After training with the modified training algorithm in the invention, the weights $w_i$ remain fixed; i.e., the vector W does not change. This is implemented in the improved TLU 400 of FIG. 4, which includes a decision function 402 and a decision history function 404. The incoming digitized signal 406 is provided to a filter 426 which reduces the noise bandwidth of the incoming signal 406. The filter 426 may occur prior to, or following, digitization of the signal. The decision function 402 includes a plurality p of registers 408, the outputs of which are multiplied by weights Wp through W1 410 as computed above, and provided to summer 412. The summer 412 output 414 is provided to threshold detector 418, which establishes the decision threshold by comparison with a decision history signal 416, as will be described. The threshold function 418 includes a difference function 418b which subtracts the decision history signal 416 from the summer output 414, and the result of this subtraction is passed to threshold detection function 418, which may compare the subtraction result to 0, and generate a 1 (or asserted) output when the summer output is greater than the decision history input 416, and a 0 (or not asserted) output otherwise. It is also possible to compare the subtraction result of 418a with other values, but in the best mode, the subtraction result is compared to zero, and the output of the threshold function 418 is a binary output. The Detector output 424 of the threshold detector 418 is also input to the decision history function 404. The decision history function 404 includes a shift register 420 which has m registers, the output of each being fed to a look up table 422, which generates the decision history subtraction signal 416 of the summer 412.

The threshold value T from signal 416 is used in the digital value comparison 418, which generates the detector output 424. However, the threshold value T depends on the previous m threshold outputs, which are stored in shift register Dn through Dn−m+1. The stored values are input in parallel to lookup table L that outputs the threshold T, which is subtracted from the value $y_n$.

During training, the training set is divided according to the m known previous threshold outputs. For example, if m=5 the set is divided into 32 subsets ($2^5$=32 is the total possible number of combinations). The previous 5 bits might have been known, for example, to be (10011). Then all vectors where the categories of the previous 5 vectors were 1, 0, 0, 1, and 1 are placed in the (10011) subset. Each subset is trained individually. The vector W is obtained by averaging the 32 individual support vectors, and the 32 individual threshold values are entered into the threshold lookup table 422.

FIGS. 5A and 6A show plots of unconditioned cell data from a channel with ISI, such as the data stream from a hard-disk-drive, where the scatterplots represent the clusters of the present sample n (horizontal axis) vs the previous sample n−1 and also vs the next sample n+1 (vertical axes). The clusters such as 521 are shown in detail region 521 in FIG. 5C, which reveals that the scatterplot comprises data points 521 with an occasional outlier 522 as is typical for sampled data in the presence of noise. FIG. 5A shows 0 regions 502 having forward hash clusters shown and 1 region 521 having distinguishing hash boundaries shown. FIG. 5A is a virtually separable scatterplot where the 0 cluster 502 is everywhere distinguishable from the 1 cluster 521, except for one small region 503 where they overlap and are therefore inseparable. In FIG. 6A the 1 510 cluster and 0 506 clusters overlap as is shown in region 508; therefore, accurate determination of the value of the present bit is not possible because of the inseparable cluster 508. In FIG. 6A, the pairs are only plotted where bit n−2 (two bits earlier) is 1 and in FIG. 6B pairs are only plotted where bit n−2 is 0. Straight lines 524 and 526 separate the two clusters in FIG. 5B and in FIG. 6B, respectively. The angles at the intercept of each line with the horizontal axis are the same but the intercept points are not equal. Each line 524 and 526 represents a separating surface; each can be implemented by the same set of TLU weights while only the threshold is changed. This illustrates a fundamental principle of TLU detection: weights are not a function of the previous detector outputs but the threshold is.

Error correcting parity check bits are added to the data bit sequence before transmission. As an example, assume that the bit sector including both data and parity bits is 1024 bits long. Let $x_n$ be the $n^{th}$ bit in the sequence, where $x_1$ through $x_{959}$ are data bits, and $x_{960}$ through $x_{1024}$ are the parity bits. The first parity check bit, $x_{960}$, is chosen so that $$x_1 \oplus x_{65} \oplus x_{129} \oplus x_{193} \oplus \ldots \oplus x_{960} = 0 \quad (1)$$

where $\oplus$ denotes modular 2 addition.

The rest of the parity check bits are chosen as follows:

$$x_2 \oplus x_{66} \oplus x_{130} \oplus x_{194} \oplus \ldots \oplus x_{961} = 0 \quad (2)$$
$$x_3 \oplus x_{67} \oplus x_{131} \oplus x_{195} \oplus \ldots \oplus x_{962} = 0$$
$$\vdots$$
$$x_{64} \oplus x_{128} \oplus x_{256} \oplus x_{320} \oplus \ldots \oplus x_{1024} = 0$$

This method will be called "non-random parity."

In this example there are 64 parity bits per sector, or an overhead of approximately six percent. The 1024-bit sector is divided into 16 subsectors of 64 bits. The $n^{th}$ row of equations (2) contains the $n^{th}$ bit of the each subsector. For example, the second bit in the second sector is $x_{66}$, which is in the second row of equations (2). If, for example, $x_{66}$ and $x_{67}$ are in error (a double error) parity checks alone cannot prove that the two errors are in the second bit position of sub sectors two and three. A double error at 15 other pairs (e.g., $x_{194}$ and $x_{195}$) will give the same parity check errors. Information from the outputs of detectors $FT_1$, $RT_1$ and $RT_2$, along with the parity checks, is used to find the true error locations ($x_{66}$ and $X_{67}$).

Usually errors will occur in bursts at serial adjacent bit positions (typically three bits). A second set of parity bits can be added to lower the bit error rate. Instead of the $n^{th}$ bit of each subsection being contained in the $n^{th}$ row, the bits for this row are selected in random order with one bit from each subsector in each row. For example, the equations might be $$x_3 \oplus x_{77} \oplus x_{130} \oplus \ldots \oplus x_{960} = 0 \quad (3)$$
$$x_{45} \oplus x_{65} \oplus x_{170} \oplus \ldots \oplus x_{961} = 0$$
$$x_{64} \oplus x_{101} \oplus x_{149} \oplus \ldots \oplus x_{962} = 0 \;,$$
$$\vdots$$
$$x_{15} \oplus x_{950} \oplus x_{155} \oplus \ldots \oplus x_{1024} = 0$$

where bits $x_{960}$ through $x_{1024}$ are added to make each row equal to zero. Furthermore, the bits are ordered so that no column contains successive bit positions, e.g., $x_{66}$ and $x_{67}$ cannot both appear in any one column. This assures that parity check when a double error occurs will indicate a double error only at the true location. Then parity checks for both methods will indicate a double error only at the true error location. This method will be called "random parity."

Figure 7:
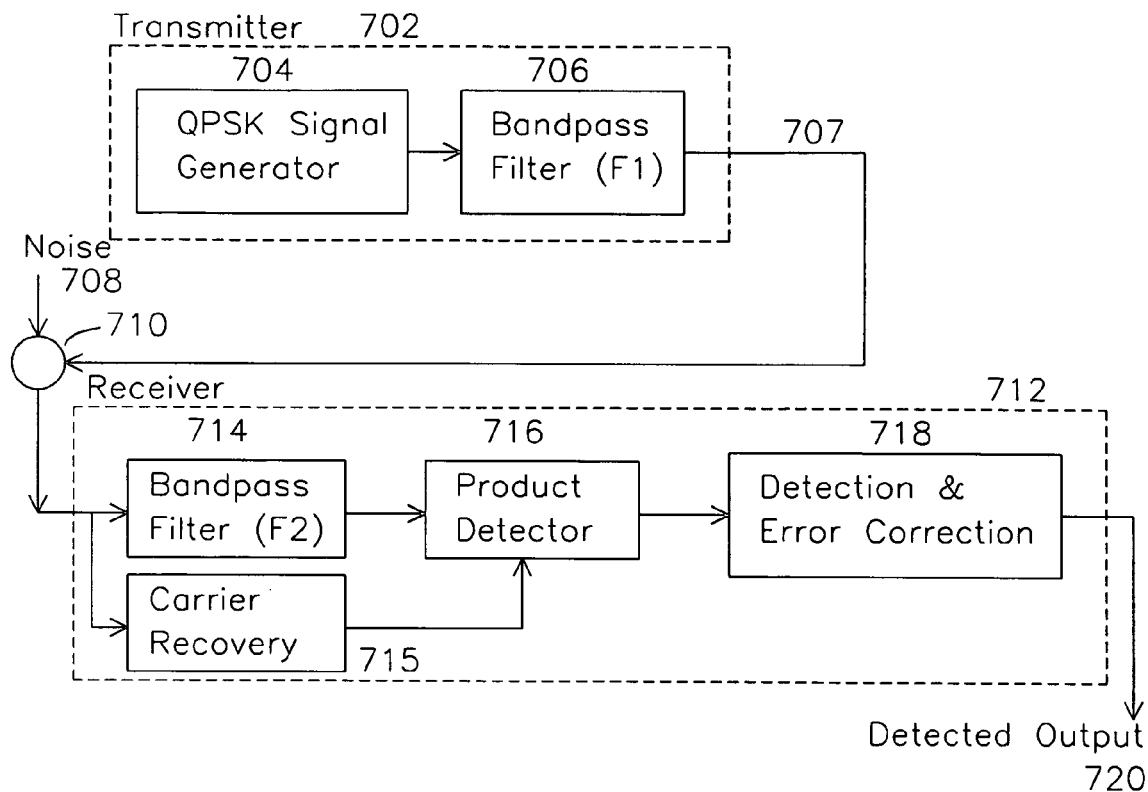
FIG. 7 shows a block diagram of a digital transmission channel; when QPSK is transmitted, separate product detectors and detection and error systems are used for the in-phase and quadrature components.

FIG. 7 shows a block diagram of an exemplar QPSK communication system 700. At the transmitter 702, both the in-phase and the quadrature components of the QPSK signal are modulated ±90 deg in QPSK signal generator 704. The QPSK modulated signal is filtered by bandpass filter F1 706. Normally, the bandwidth of F1 706 will be narrow compared to the bit rate (number of bits per sec) passing through the channel. For example, the rate might be $10^6$ bits per second and the bandwidth of F1 706 could be 200 kHz. Such fractional bandwidth ratios will cause significant ISI in the transmitted signal 707.

Prior to the receiver input there is receiver noise and channel noise 708 which is shown added 710 to the incoming signal to the receiver 712, where the incoming signal and noise are filtered by bandpass filter F2 714. The bandpass function of F2 714 may be equal to the bandpass of F1 706. The output of F2 714 is input to the product detector 716 which multiplies the recovered carrier 715 against the incoming signal to perform baseband detection. The carrier recovery may be alternately performed with a separate input which is a phase reference that is also transmitted. Normally the phase of this reference will equal the reference of the transmitter in-phase component before modulation. The change in phase during transmission will equal the change in phase of the transmitted signal during transmission. The phase reference is usually derived from the receiver using phase locked loops and other prior art methods.

In the product detector 716, the phase reference 715 can be multiplied by the filter F2 714 output and the product detector 714 may also include after detection a low pass filter which may have a bandwidth equal to the bandwidth of filter F2 714. The output of the product detector 716 filter is input to the detection and error correction circuit 718.

Figure 8:
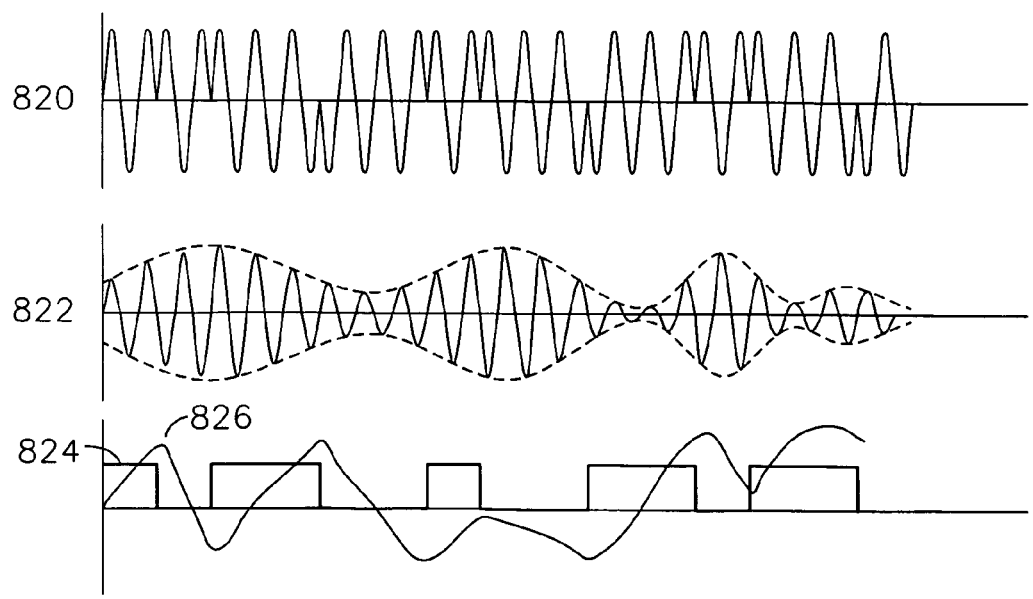
FIGS. 8A, 8B, and 8C shows examples of waveforms that occur in a channel described by the block diagram shown in FIG. 6.

FIG. 8 shows the waveform 820 for the in-phase component that is input to the transmitter bandpass filter F1 706 of FIG. 7. A plot of the quadrature component for bandpass filter F1 input would be identical except for the modulation by a different input bit sequence for orthogonal channel use by a different data stream, otherwise it would carry the quadrature encoding of the single bit stream being encoded. Waveform 822 of FIG. 8 is the in-phase component at the output of the bandpass filter F1 707 of FIG. 7. The waveform is amplitude and phase modulated due to ISI, which causes peaks and valleys to form in the envelope (shown with a dashed line) of the waveform.

Waveform 826 is the noiseless output from the product detector 716 of FIG. 7. If there were no ISI this output would go high when the input bit was 1 and low when the bit was 0, as shown in waveform 824. With ISI it is difficult to distinguish the 1s and 0s of waveform 824 from the baseband waveform 826.

Figure 9:
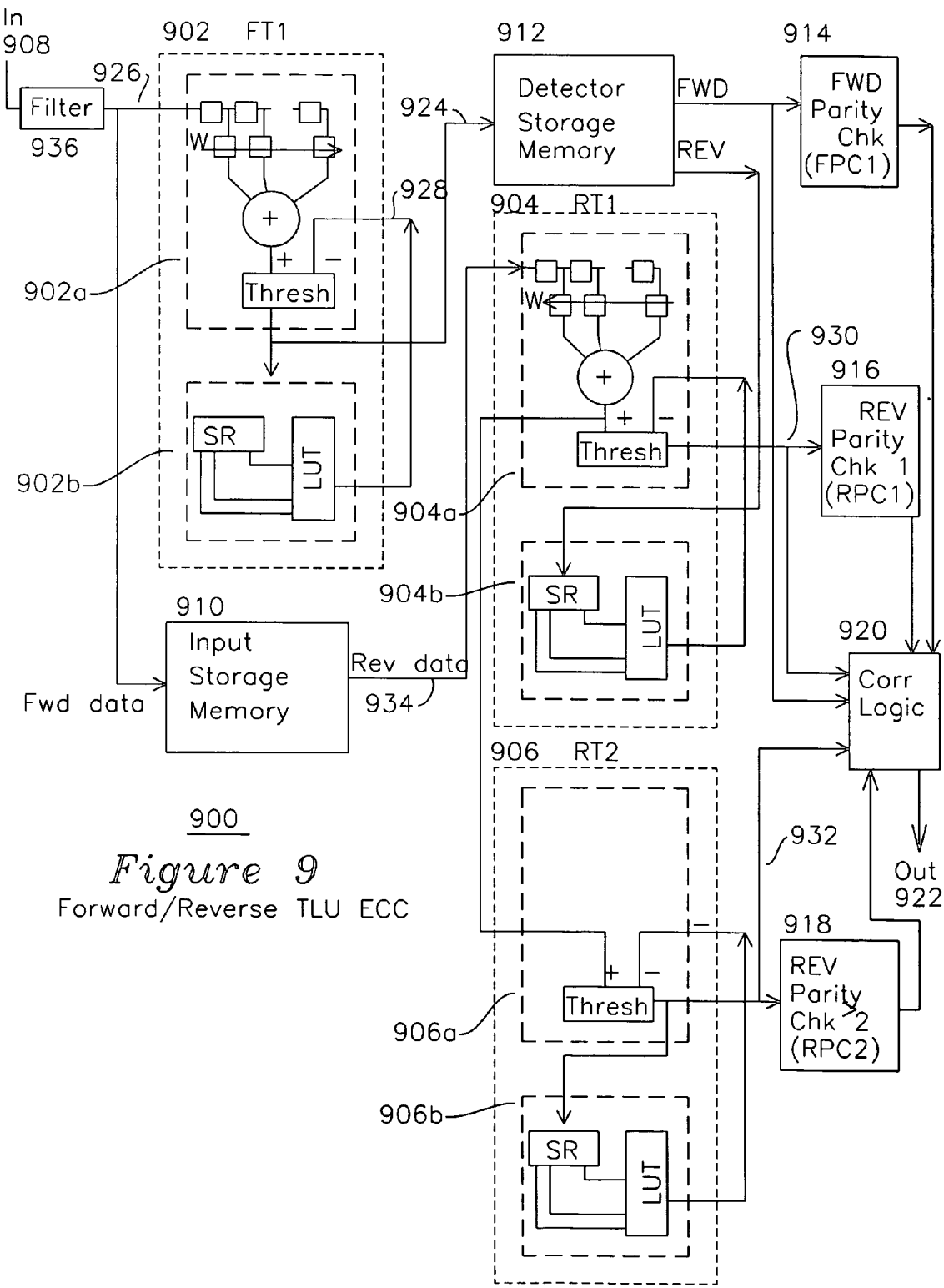
FIG. 9 shows a block diagram of the error correction system; the one TLU in the forward direction and the two in the reverse direction use a common set of weights but different thresholds.

FIG. 9 is the block diagram of an error correction system that contains one TLU (FT1) 902 that processes the incoming signals 926 in the forward direction and two TLUs (RT1 904 and RT2 906) that process incoming signals in the reverse direction. For clarity in describing the invention, the following nomenclature is adopted, which may be understood in combination with FIG. 4. The Forward Threshold Logic Unit (FT1) 902 of FIG. 9 includes the functions of FIG. 4 described earlier, including a decision function 402 having an input 407, registers 408, weight coefficients W which are multiplied by the register contents and summed 412 to generate an output which is compared to a threshold 418 by subtracting decision history signal 416, which is developed from a decision history function 404. The decision history function 404 accepts an input 424 which is fed to a shift register 420 which uses threshold look-up table 422 to generate a decision history output 416.

The overall objective of the circuit of FIG. 9 is to perform forward and backward decision functions on the signal using three different metrics, and three different TLUs in different configurations, to compare the results of each TLU, and to produce an output 922 which represents the error corrected output data. FT1 902 has a decision function 902*a* which receives filtered input data 926 and decision history 928 from decision history function 902*b* to produce output decisions 924, in the manner identical to what was described for FIG. 4. RT1 904 is operating on the same input data 926 which has been reversed in time by input storage memory 910, which generates a time-reversed output 934 after buffering input data 926. The weighting functions W of decision function 904*a* are reversed in sequence, and the decision history function 904*b* operates on time-reversed decisions from detector storage memory 912, noted as "REV" output. In this manner, RT1 generates output decisions 930 based on the time-reversed input data 934 and decision history from time-reversed FT1 decisions via REV output of storage memory 912. RT2 906 uses the output of the summer in RT1 904*a*, and the decision function 906*a* generates decisions 932 with the threshold comparison made between the output of summer of 904*a* and decision history from 906*b*. Because RT2 is operating on the weighted multiplication of decisions from reversed data 934 and weights W already computed in RT1, it is possible to simplify RT2 by using the values computed in RT1 and deleting the identical circuitry from RT2, as shown in FIG. 9. Each source of decisions has a parity checker, such that FT1 data going to detector storage memory 912 is fed to FPC1 914, decisions from RT1 go to RPC1 916, and decisions from RT2 are fed to RPC2 918. All of the decisions from FT1, RT1, and RT2, along with the outputs of the respective parity checkers FPC1, RPC1, and RPC2 are fed to correction logic 920, as will be described later. The signals from the product detector first are filtered by filter 936 to increase the SNR by reducing out-of-band noise. The filtered signals are input to FT1 and simultaneously stored in sample storage 910 as previously described until one data block is stored.

Consider a data block size of 1024 samples. This size is assumed for illustration purposes only; it can be any practical number. As the samples are stored in memory 910, the detected outputs (1s and 0s) from FT1 902 output 924 are stored in the detector output storage 912. Upon storage completion the stored samples are processed in the reverse direction by reverse TLU RT1 904 and reverse TLU RT2 906; the reverse processing order is 1024, 1023, . . . , 2, 1.

The reverse TLUs, RT1 904 and RT2 906, have a common set of weights W, and the weight multiplication and summing is done only once per sample, as was described for FIG. 4. The thresholds TR2 for detector RT2 are generated by the decision history function 906*b* according to the previous decision outputs from RT2 906*a*. For example, assume that the shift register for RT2 stores the previous five outputs. Then when processing sample 500 the outputs from RT2 when samples 501, 502, 503, 504 and 505 were detected would determine the threshold value of TR2. Similarly, the outputs from FT1 set the threshold TR1, as was also described for the decision history function of FIG. 4. For example, when sample 500 is detected by TR1 the outputs from FT1 501, 502, 503, 504, and 505 set TR1.

Figure 10A:
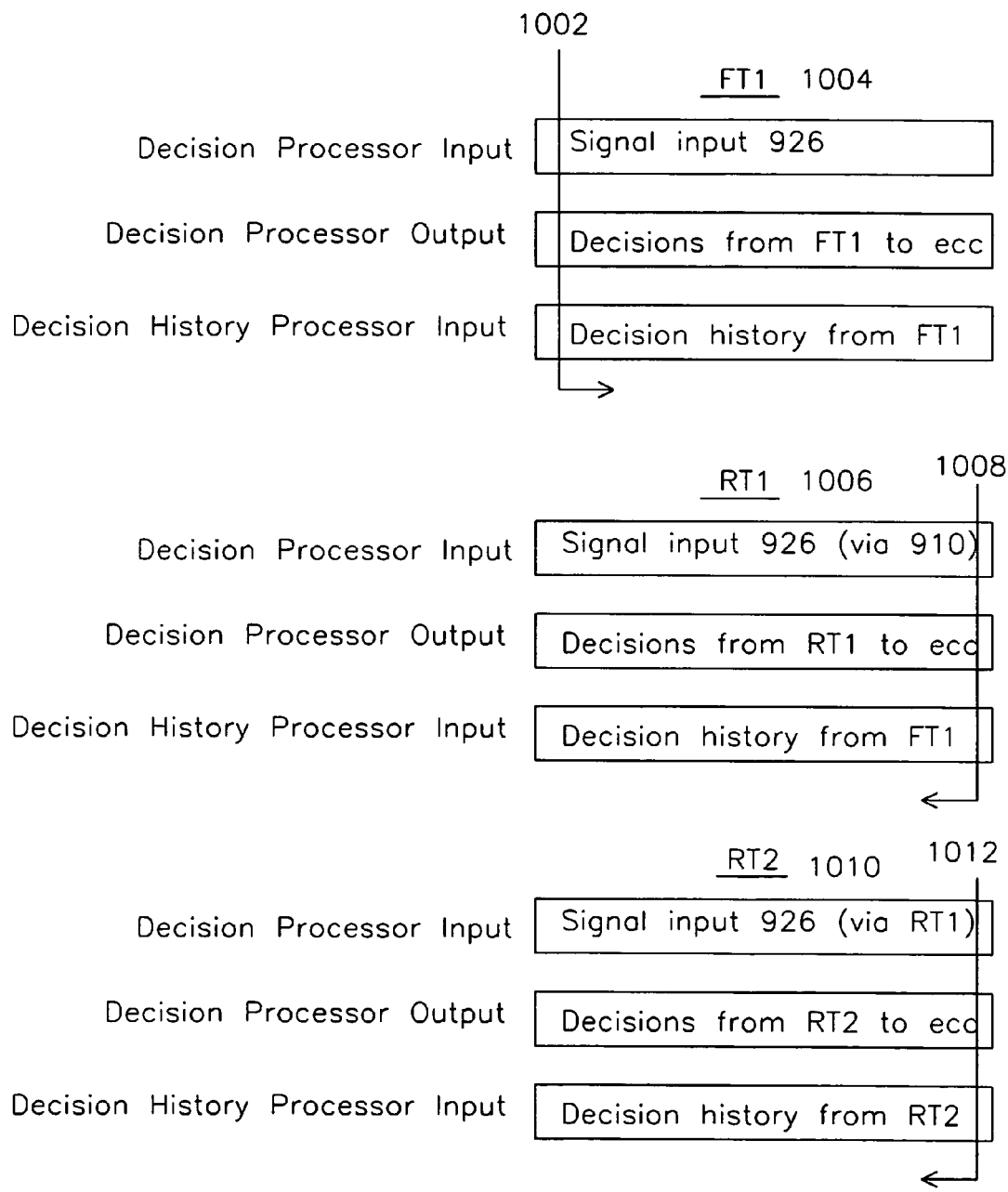
FIGS. 10A and 10B shows the processor operating on burst errors in the forward and reverse direction.

FIG. 10A shows the operation of each of the threshold logic units FT1, RT1, RT2 of FIG. 9. Each TLU is operating on either a forward or reverse signal input 926, which may use buffer 910 as described earlier. FT1 1004 operates in the forward direction using signal input 906, and makes decisions using a threshold from decision history computed from decisions made by FT1. RT1 1006 operates in the reverse direction 1008 on signal input 926 (via buffer 901), and makes decisions using a threshold from decision history computed from decisions made by FT1. RT2 1010 operates in the reverse direction 1012 on signal input 926 (via buffer 901), and makes decisions using a threshold from decision history computed from decisions made by RT2. In this manner, decisions are made by each decision processor using different combinations of decision histories applied to the same input signal and weights W, whereby the direction of computation (forward or reverse) is preserved, which reduces the effect of burst errors.

Figure 10B:
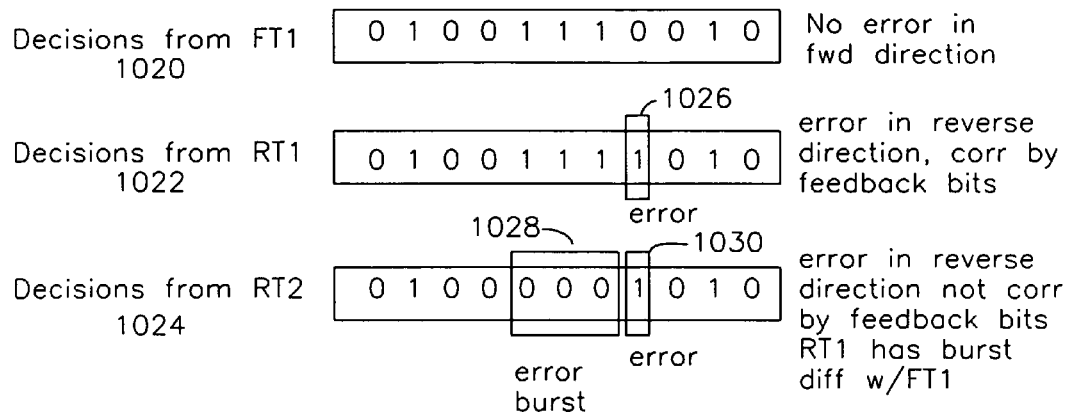

Burst errors (more than one successive bit error) in FT1 902 and RT2 906 occur because the first error results in both an incorrect value stored in shift register SR1 and an incorrect value for the threshold, which may cause another error. If there is no error in the forward direction all the bits in the shift register of RT1 904*b* will be correct and RT1 will not have burst errors when there is an error in the reverse direction, as illustrated in FIG. 10B. There will be only one difference between the outputs of FT1 902 and RT1 904, and that is at the position of the reverse error. This information will be used by the correction logic 920.

A basic principle of forward-reverse processing is that an error burst will start with the first error. With high probability, samples other than this first error will not be corrupted by noise bursts, and therefore only a single signal sample will be corrupted. Therefore, if there are errors in both directions, there will be overlap only at the site of the corruption. The probability is very great that errors have occurred whenever the outputs from FT1 902 and RT2 906 are different. The parity bits are used to detect the overlapping bit error.

The input to the error-correction logic 920 is all binary and consists of outputs from FT1 924 via storage memory 912, the detected outputs of RT1 930 and RT2 932, and the parity outputs from RPC1 914, RPC1 916, and RPC2 918, respectively, as described earlier. Within the logic the differences at each bit position n are defined as $D_{11}(n)=OFT1 \oplus ORT1$ $D_{12}(n)=OFT1 \oplus ORT2$ $D_{22}(n)=ORT1 \oplus ORT2$ where OFT1 is the output of FT1, ORT1 is the output of RT1, and ORT2 is the output of RT2. The nine outputs OFT1, ORT1, ORT2, FC1, RC1, RC2, $D_{11}$, $D_{12}$, and $D_{22}$ are then the logic inputs. The logic will output a 1 or a 0.

The logic can be implemented in several forms. One is a simple switching function or lookup table where the dimension of the binary input vector is nine and information about errors in adjacent bit intervals is not used. The maximum number of possible vector values is 512; however, experience has shown that approximately 300 of these vector values never occur.

A classification method is as follows. During training, many nine-dimensional vectors are generated and counts are made of both the number of times the correct bit value for each vector is 1 and the number of times the correct value is 0. For example, the correct value for vector (101011100) might be 1 96 times and 0 10 times. During testing, when this vector occurs the classification would be 1 because 1 was counted more frequently during training.

During training, almost always for a given vector either the 1 count is zero or the 0 count is zero. It is unusual for both counts to be greater than zero. When both are greater than zero and equal or when both counts equal 0 the classification is arbitrarily assigned a 1 or a 0.

One of several widely available switching-function generation programs can be used to determine the binary logic.

The BER can be reduced by using some of the nine input variables from bit intervals adjacent to the interval that is being tested. For example, at sample n If $D_{11}(n)=1$ AND $D_{11}(n-1)=0$ AND $D_{11}(n+1)=0$ then E=0, else E=1, where E is the tenth input to the correction logic. This operation determines whether differences either side of n are zero.

Define $$G_1i=D_{11}(n+i)$$

$$G_2i=D_{11}(n-i)$$

$$G_3i=D_{12}(n+i)$$

$$G_4i=D_{12}(n-i)$$

$$G_5i=D_{22}(n+i)$$

$$G_6i=D_{22}(n-i)$$

where n+i<1024 and n−i>0.

$G_{1i}$, $G_{2i}$, $G_{3i}$, $G_{4i}$, $G_{5i}$, and $G_{6i}$ are additional elements in the vector input to the error correction logic.

For example, if i=1, there will be 16 inputs to the error correction logic because of the six additional inputs due to the $G_{11} \ldots G_{61}$. Then there are $2^{16}$ (65 k) possible combinations. A set of samples with known signals can be used to generate the 16 inputs to determine which of the 64K are possible. Experience has shown that only a small fraction will occur.

Another form of the error correction logic that is practical for use when many adjacent bit intervals are included in the processing will now be described. It can be implemented using Boolean logic.

Error processing is done on one block of B bit positions at a time. For illustrative purposes it will be assumed that a block of B=1024 bit positions, 1 through 1024, have been processed by FT1 in the forward direction and 1024 outputs of FT1 are stored in the detector output storage. During reverse processing the RT1 and RT2 error correction is done on a segment of P consecutive bit positions, for a total of B/P segments. Let P=8 for this example, which results in 128 segments. For example, these positions could be numbers 1016, 1015, 1014, 1013, 1012, 1011, 1010 and 1009. The numbers for P and B (8 and 1024) are used for illustrative purposes only and any practical set can be used. All 1024 bit positions are contained in the 128 non-overlapping segments.

Additional Definitions of Variables

Definition of XV(1) . . . XV(12)

A difference between two TLU outputs is designated by the number 1 if the two outputs at a given bit position are not equal and by a 0 if they are equal. For example, if the output from FT1 is not the same as the output from RT1 at bit position 1012 then the difference D (FT1, RT1)=1.

1. If the number of bit positions within the segment where D (FT1, RT1)=1 is greater than 1 then XV(1)=1 else XV(1)=0 (i.e., the error is not a single-bit error).
2. If the number of bit positions within the segment where D (FT1, RT2)=1 is greater than 1 then XV(2)=1 else XV(2)=0.
3. If the number of bit positions within the segment where D (RT1, RT2)=1 is greater than 1 then XV(3)=1 else XV(3)=0.

At a given bit position within the segment:
4. XV(4)=D(FT1, RT1)
5. XV(5)=D(FT1, RT2)
6. XV(6)=D(RT1, RT2)

At a given bit position within the segment the parity check is made with the non-random parity designation:
7. If parity fails for the FT1 output XV(7)=1 else XV(7)=0
8. If parity fails for the RT1 output XV(8)=1 else XV(8)=0
9. If parity fails for the RT2 output XV(9)=1 else XV(9)=0

At the given bit position within the segment the parity check is made using the random parity designation:
10. If parity fails for the FT1 output XV(10)=1 else XV(10)=0
11. If parity fails for the RT1 output XV(11)=1 else XV(11)=0
12. If parity fails for the RT2 output XV(12)=1 else XV(12)=0

The variables (XV(1), XV(2), . . . XV(12)) form a 12-bit binary number (the "processing result"); there are $2^{12}$ or 4096 possible processing results. A set of signal and noise waveforms called training waveforms, where the correct bit value at each bit interval is known, is processed to generate the XV(n) for each bit interval. The number of times the correct value for each bit interval matches the FT1 output is counted (the "correct count"). The number of times the correct bit value does not match the FT1 output also is counted (the "incorrect count"). Typically less than 1000 of the 4096 numbers will occur during training, and only a small number (less than 1%) will have both counts greater than zero.

A lookup table is made as follows, with all possible processing results as input. For a given processing result, if the incorrect count is 0 and the correct count is greater then 0, a 1 is entered into the table. Likewise, if the correct count is 0 and the incorrect count is greater than 0, a 0 is entered. If both counts are 0 or both are not, a 2 is entered. For example, if the processing result was (10101110) and part of the time OFT1 was correct and part of the time OFT1 was in error, neither count would be 0, and therefore a 2 would be entered for vector (10101110).

Definition of YXOR

At a given bit position a parity check is made with non-random parity.
1. YXOR is 0 if
   a. Both FT1 and RT2 parities fail
   or
   b. Both FT1 and RT2 parities do not fail
2. YXOR is 1 if
   a. FT1 parity fails and RT2 parity does not fail
   or
   b. FT1 parity does not fail and RT2 parity fails Definition of ZXOR At a given bit position a parity check is made with non-random parity.
1. ZXOR is 0 if
   a. Both RT1 and RT2 parities fail
   or
   b. Both RT1 and RT2 parities do not fail
2. ZXOR is 1 if
   a. RT1 parity does not fail and RT2 parity fails
   or
   b. RT1 parity fails and RT2 parity does not fail Definition of SA1, SA2, SA3 and SA4

At a given bit position a parity check is made with non-random parity.
1. SA1 is the number of times in the segment where D(FT1, RT2)=1 and FT1 parity does not fail plus the number of times D(FT1, RT2)=0 and FT1 parity fails.

2. SA2 is the number of times in the segment where D(FT1, RT2)=1 and RT2 parity does not fail plus the number of times D(FT1, RT2)=0 and RT2 parity fails.
3. SA3 is the number of times in the segment where D(FT1, RT1)=1 and FT1 parity does not fail plus the number of times D(FT1, RT1)=0 and FT1 parity fails.
4. SA4 is the number of times in the segment where D(FT1, RT1)=1 and RT1 parity does not fail plus the number of times D(FT1, RT1)=0 and FT1 parity fails.

Definition of SB1

SB1 is the number of times in the segment where D(FT1, RT1)=1.

Error Detection and Correction Logic

The logic for the ECC is diagrammed in FIGS. 11A through 11D where the processing starts at entry 1100 with a segment of data, which may be 8 bits long, or any other length as required, in step 1102.

During the first stage of the error correction and detection the processing result is generated and the detection and correction proceed as follows:

1. Step 1104: For each bit in a segment the binary number (XV(1), XV(2), ..., XV(12)) is generated (all the XV(n)=1 or 0 so inside the parentheses is a binary number). If the corresponding number in the lookup table is 1 the classification is the same as OFT1.
2. If the corresponding number is 0 then the classification is opposite OFT1; e.g., if OFT1=1 (step 1116) then the classification is 0 (step 1118).
3. Step 1112: If the corresponding number is 2, the flag is set and the classification at that bit position is not made (step 1114).

Figure 11A:
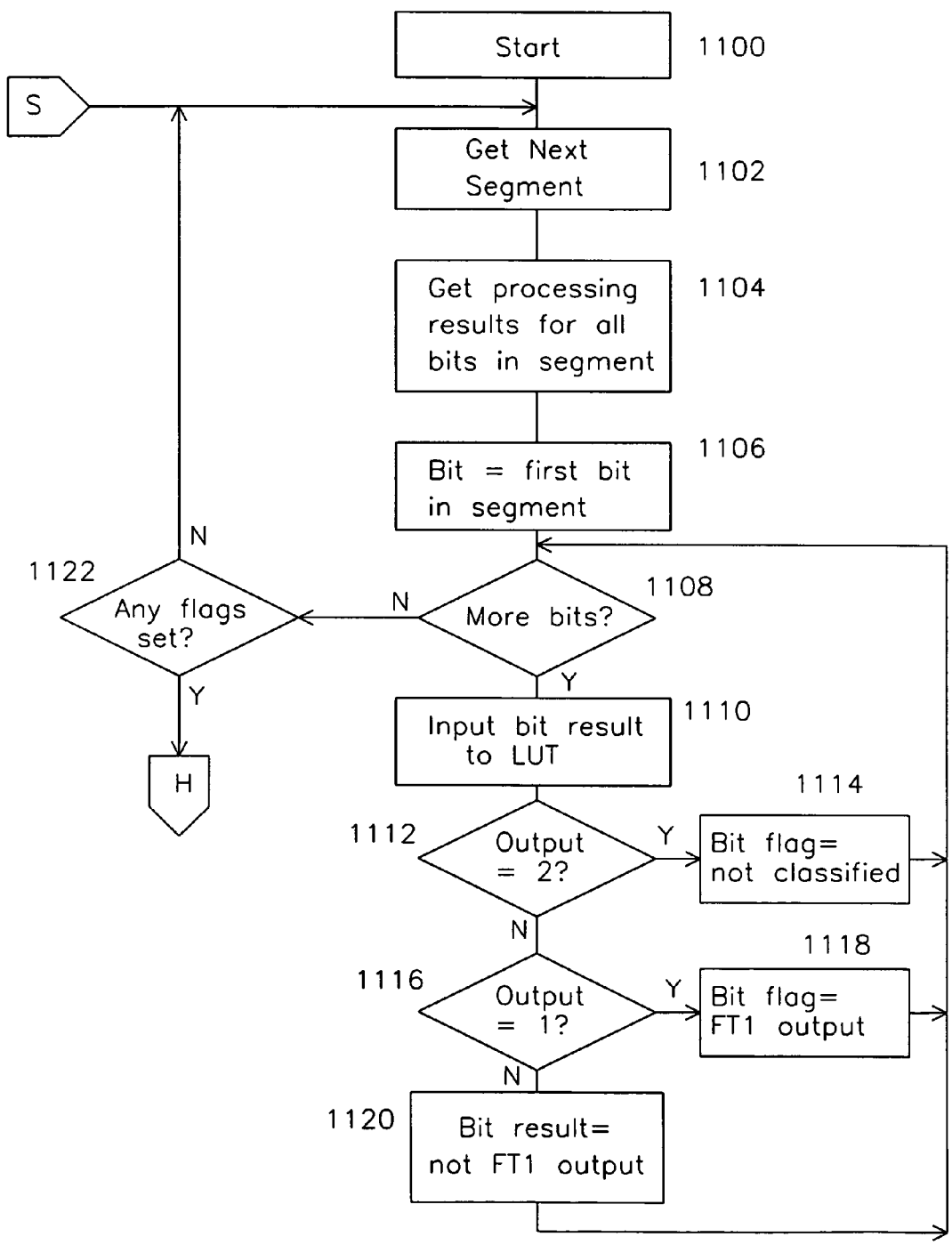
FIGS. 11A through 11D shows the flowchart for the error correction logic of FIG. 9.
Figure 11B:
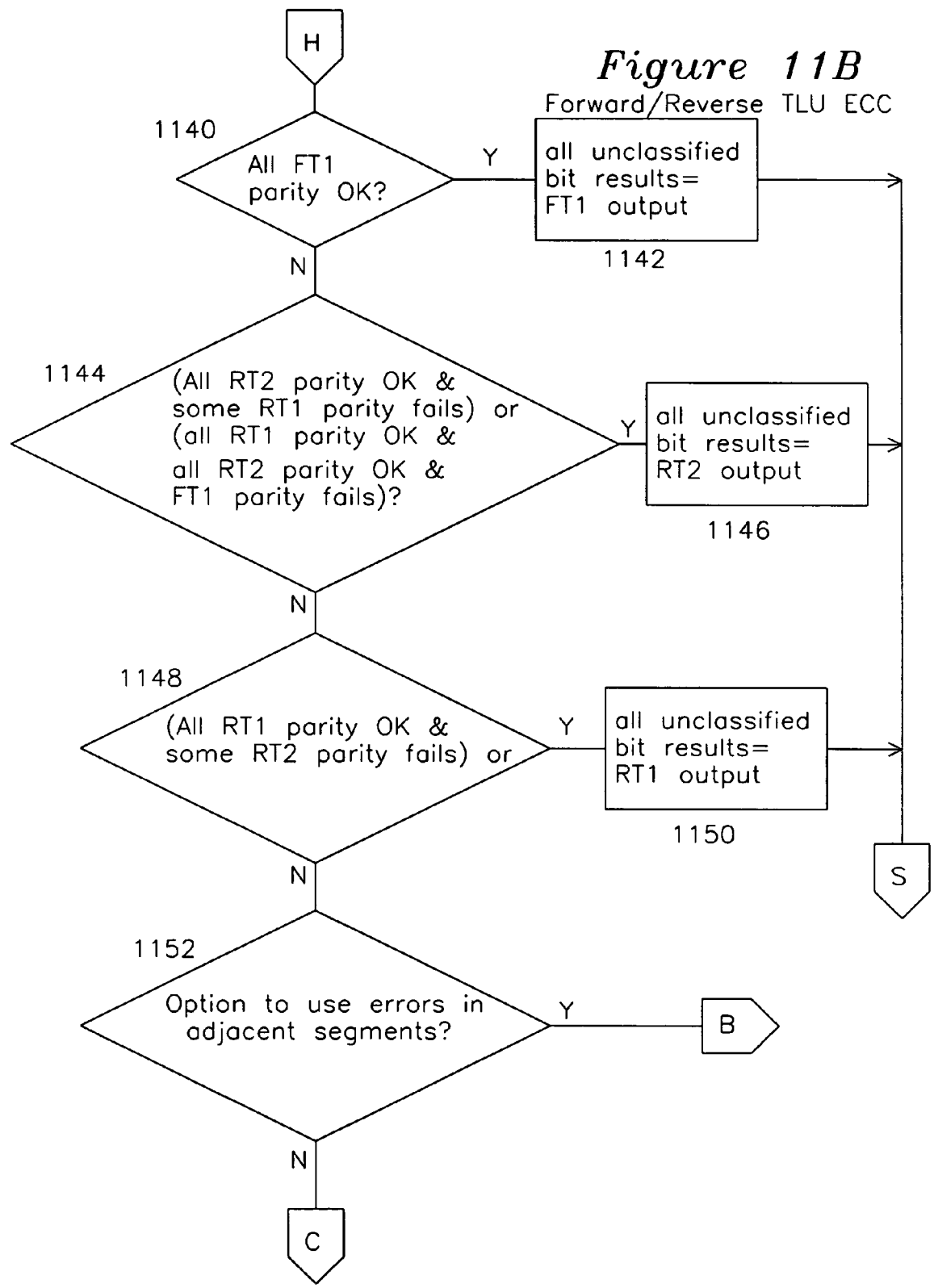

These processes are done for all bits in the segment (typically 8). If the flag is set 1122 the processing is continued as shown in FIG. 11B.

An important principle is as follows: All bits in the segment will be processed according to the logic shown in FIGS. 11A through 11D; however, only bits that have not been classified by the steps above will be classified. The phrase "all bits in segment" in a classification box is understood to mean only bits that have not been previously classified. In a classification box where only a single bit is classified the bit is not classified again if there has been a previous classification.

For example, assume that there are 8 bits in the segment and that both correct and incorrect counts are greater than zero (the table entry is 2) for bits 4 and 5. Bits 1, 2, 3, 6, 7, and 8 have been classified with the lookup table according to their processing result. The flag has been set and, for example, that in the first decision box in FIG. 10A it is determined that FT1 parity is OK for all eight bits in the segment. Branching through "yes" from the diamond leads to a classification box where bits 4 and 5 will be classified the same as the FT1 output.

The remaining logic details will now be described.

1. When the flag is set in FIG. 10A 1122 and the following test is made in step 1140: Is the FT1 parity OK for all bits in the segment?
   Yes: classify all bits in the segment the same as the FT1 outputs at each bit position (step 1142).
   No: go to step 2 (step 1144).
2. (Step 1144) Test: Is (RT2 parity OK and RT1 parity not OK) or (RT1 parity OK and RT2 parity OK and FT1 parity not OK) for all bits in the segment?
   Yes: (step 1146) classify all bits in the segment the same as the corresponding RT2 outputs.
   No: (step 1148) go to step 3.
3. (Step 1148) Test: Is RT1 parity OK in segment but RT2 parity is not OK somewhere in segment?
   Yes: (step 1150) classify all bits in the segment the same as the corresponding RT2 output.
   No: (step 1152) go to step 4.
4. (Step 1152) Test: Are errors in segments adjacent to the current segment to be used? (Use of these errors is an input parameter)
   Yes: go to B 1156 in FIG. 11C.
   No: go to C 1178 in FIG. 11D; bypass the logic in FIG. 11C.
   Note: Information in adjacent segments is used because burst errors may cross segment boundaries.

Figure 11C:
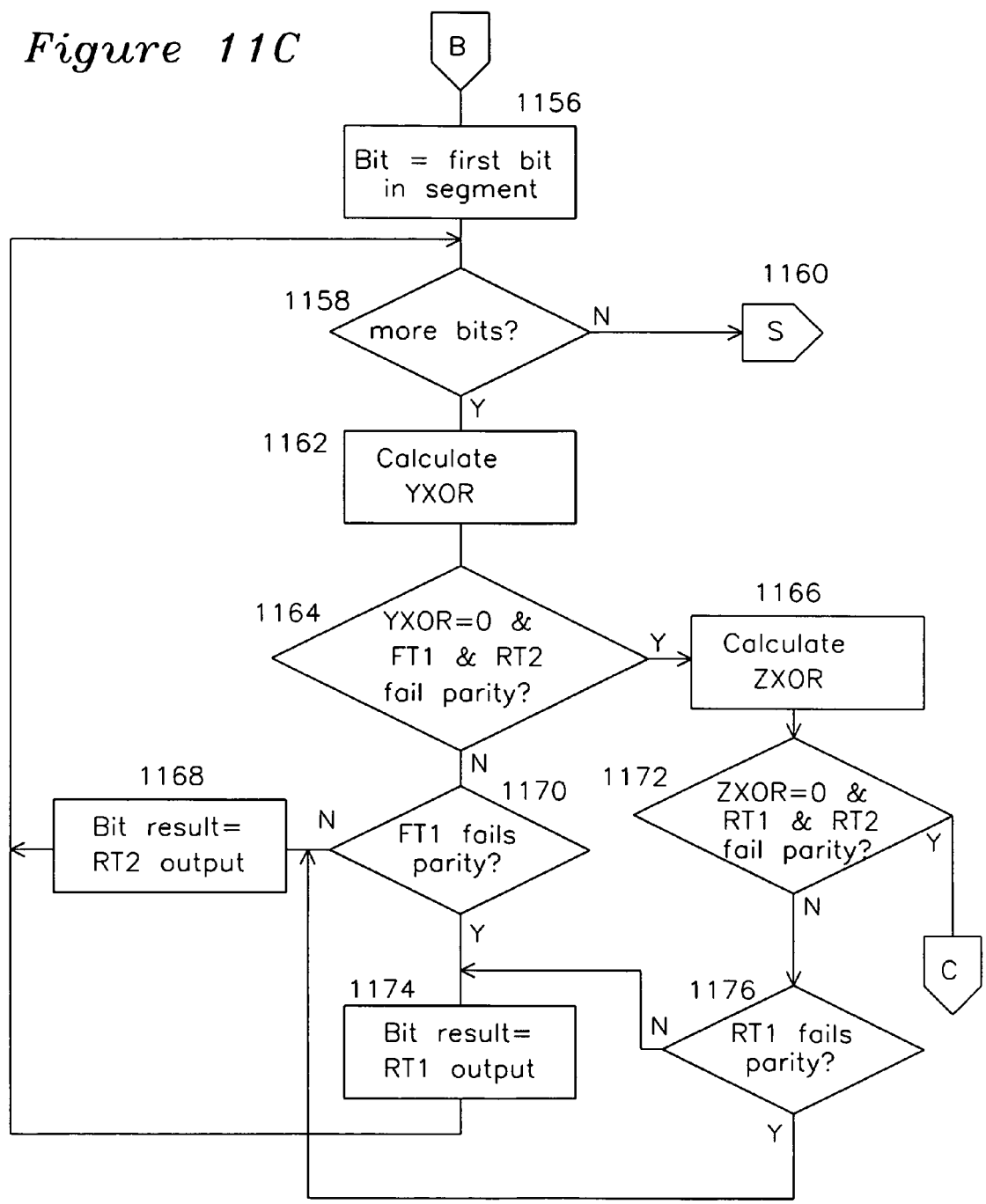
Figure 11D:
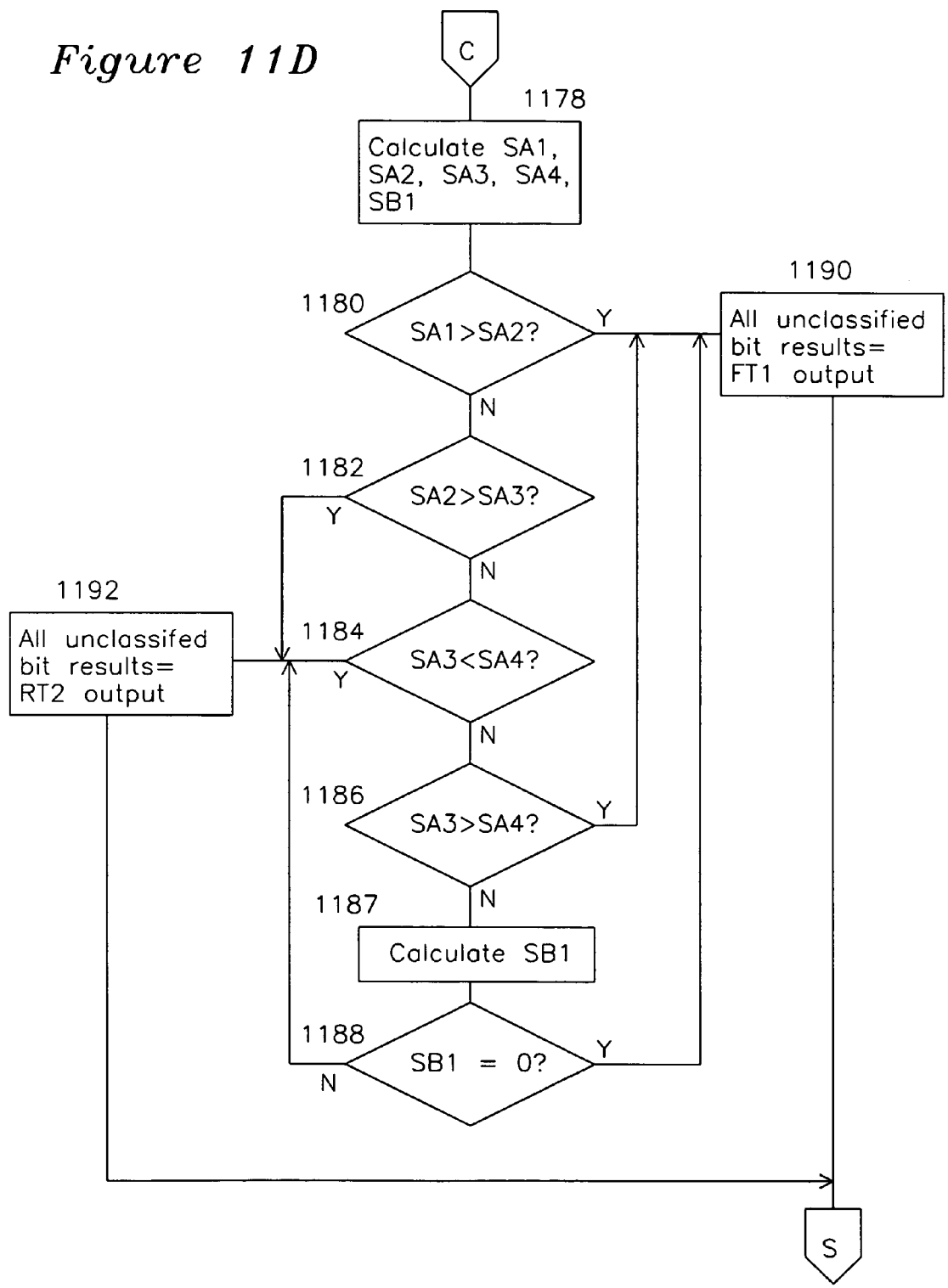

If adjacent error use has been selected (step 1152) proceed to B of FIG. 11C and calculate YXOR for each bit in the "extended" segment. The extended segment will include bit positions each side of the segment that has been used in steps 1 through 4. The number is an input parameter and any reasonable number can be used. In steps 5 through 6.2 the segment is extended.

5. (step 1162) Calculate YXOR for each bit in segment (see definition of variables). Start with the first bit in the segment (step 1156) and process all bits in sequence.
6. Test: (step 1164) YXOR=0 and FT1 and RT2 parities fail.
   Yes: (step 1166) calculate ZXOR, then go to step 6.1.1
   No: go to step 6.2 (1172)
6.1.1 (step 1172) Test: ZXOR=0 and RT1 parity not OK
   Yes: go to C in FIG. 11D (step 1178)
   No: go to step 6.1.2 (step 1176)
6.1.2 Test: (step 1176) RT1 fails parity
   Yes: classify the same as the RT1 output (step 1168)
   No: classify the same as the RT2 output (step 1174)

The segment length for the remainder of the logic is standard and not extended.

7. (Step 1178) Calculate SA1, SA2, SA3 and SA4 (see definition of variables).
8. (Step 1180) Test SA1>SA2
   Yes: (step 1190) all bits in segment classified same as corresponding FT1 output. After the last segment bit has been classified go to start 1102.
   No: go to step 9 1182.
9. (Step 1182) Test SA2>SA3
   Yes: (step 1192) Classification same as corresponding RT2 output all bits in segment. After the last bit in the segment has been classified go to start step 1102.
   No: go to step 10 (step 1184).
10. (Step 1184) Test: SA3>SA4
    Yes: (step 1190) Classified same as corresponding RT2 output all bits in segment. After the last bit in the segment has been classified go to start.
    No: (step 1187) Calculate SB1. Go to step 11 (step 1188).
11. Test: (Step 1188) SB1=0
    Yes: (step 1190) Classify all bits in segment same as corresponding FT1 output.
    No: (step 1192) Classify all bits in segment same as corresponding RT2 output.

Go to start (step 1102).

We claim:

1. A threshold logic unit (TLU) for performing detection on a serial stream of multi-valued data, the TLU having:
   a decision function having:
      a plurality p of registers for storing a succession of input values, each said register having an output and an input coupled to an adjacent said register;

a plurality p of multipliers, each said multiplier forming the product between a unique said register input or output and a weight value W;

a summer having an output equal to the sum of said multiplier products;

a threshold for converting the output of said summer to a single-valued output by comparing the output of said summer to a decision history value;

a decision history function having:

a shift register having a plurality m of registers, each said register output coupled to an adjacent said register input;

a look-up table coupled to each of said m registers, said look-up table converting the address formed by said shift registers into an output value;

said decision history function look-up table output value generating said decision history value.

2. The TLU of claim 1 where said look-up table contains values conditioned from previous said decisions.

3. The TLU of claim 1 where said look-up table contains values formed from an optimum decision surface derived from a plurality of vectors forming a training set, said vectors formed in clusters according to the following procedure:

a) trimming said vectors from said clusters where said vectors are determined to cause said clusters to overlap;

b) translating the $X_n$ vector coordinates by subtracting the mean value $\overline{X}$ of all vectors in said training set;

c) adapting said weights W by removing said vectors that cause said weights to not converge and repeating said adaptation with the reduced training vector set;

d) converting said vector W to a unit vector;

e) adjusting each dimension of said unit vector until optimum separation between clusters is achieved.

4. The TLU of claim 3 where said optimum separation is accomplished by incrementally applying an amount δ as follows:

incrementing said unit vector by $\delta u_i$ until a new surface intersects any said cluster as determined by testing Wn·Xn to determine whether the result is a 1 or a 0, thereby indicating said intersection;

changing a direction of rotation by negating said δ, dividing said δ by 2, and continuing to increment said vector by said δ/2 until the resultant surface no longer intersects a cluster, thereby forming a final vector.

5. The TLU of claim 4 where said optimum separation is further accomplished by saving said final vector as $D_{max}$, repeating said optimum separation process starting with original said vectors and changing the sign of the original δ to produce a final TLU vector $D_{min}$ and using the mean of $D_{max}$ and $D_{min}$ as said final vector.

6. The TLU of claim 1 where the category of $X_n$ is the value of the $n^{th}$ bit, and said weights are formed from:

if $W_n \cdot X_n \geq T_n$ and the category is 0 then $W_{n+1} = W_n + \delta X_n$ $T_{n+1} = T_n - \delta$ if $W_n \cdot X_n < T_n$ and the category is 1 then $W_{n+1} = W_n - \delta X_n$ $T_{n+1} = T_n + \delta$, where $0 < \delta < 2$ if $W_n \cdot X_n \geq T_n$ and the category is 1, or
if $W_n \cdot X_n < T_n$ and the category is 0, then $W_{n+1} = W_n$ $T_{n+1} = T_n$.

7. An error detection and correction apparatus operating on a stream of input data, the apparatus having:

a forward threshold logic unit (FT1) having a decision function and a decision history function;

a first reverse threshold logic unit (RT1) having a decision function and a decision history function;

a second reverse threshold logic unit (RT2) having a decision function and a decision history function;

each said decision function comprising a plurality of registers coupled, in sequence, to a decision function input, said registers uniquely coupled to a plurality of multipliers multiplying each said register value with a weight value W, a summer coupled to and adding each said multiplier output, thereby generating a summer output, and said decision function having a threshold comparing a decision history input to the output of said summer to form a decision function output;

each said decision history function having an input coupled to a shift register, said shift register outputs forming an address for a look-up table, said look-up table producing the value of said decision history input;

where an input signal is coupled to said FT1 input and also to an input storage memory for generating a time-reversed version of said input signal, said time-reversed signal coupled to said RT1 decision function input;

the input of said FT1 decision history function coupled to said FT1 decision function output and to detector storage memory for time-reversing said FT1 decisions and coupling them to said RT1 decision history input function;

said RT1 decision function summer output coupled to said RT2 decision function threshold input, said RT1 decision history function output coupled to said RT1 decision threshold input;

said RT2 decision history function output coupled to said RT2 decision threshold input;

the output of said error correction apparatus formed from said FT1 decision output via said detector storage memory forward output and a parity check of said detector storage memory forward output, said RT1 output and a parity check of said RT1 output, said RT2 output and a parity check of said RT2 output.

8. The TLU of claim 7 where at least one of said look-up table contains values conditioned from previous said decisions.

9. The TLU of claim 7 where at least one of said look-up table contains values formed from an optimum decision surface derived from a plurality of vectors forming a training set, said vectors formed in clusters according to the following procedure:

a) trimming said vectors from said clusters where said vectors are determined to cause said clusters to overlap;

b) translating the $X_n$ vector coordinates by subtracting the mean value $\overline{X}$ of all vectors in said training set;

c) adapting said weights W by removing said vectors that cause said weights to not converge and repeating said adaptation with the reduced training vector set;

d) converting said vector W to a unit vector;

e) adjusting each dimension of said unit vector until optimum separation between clusters is achieved.

10. The TLU of claim 9 where said optimum separation is accomplished by incrementally applying an amount δ as follows:

incrementing said unit vector by $\delta u_i$ until a new surface intersects any said cluster as determined by testing Wn·Xn to determine whether the result is a 1 or a 0, thereby indicating said intersection;

changing a direction of rotation by negating said δ, dividing said δ by 2, and continuing to increment said vector by said δ/2 until the resultant surface no longer intersects a cluster, thereby forming a final vector.

11. The TLU of claim 10 where said optimum separation is further accomplished by saving said final vector as $D_{max}$, repeating said optimum separation process starting with original said vectors and changing the sign of the original δ to produce a final TLU vector $D_{min}$ and using the mean of $D_{max}$ and $D_{min}$ as the adjusted optimal TLU.

12. The TLU of claim 7 where the category of $X_n$ is the value of the $n^{th}$ bit, and said weights are formed from:

if $W_n \cdot X_n \geq T_n$ and the category is 0 then $$W_{n+1} = W_n + \delta X_n$$

$$T_{n+1} = T_n - \delta$$

if $W_n \cdot X_n < T_n$ and the category is 1 then $$W_{n+1} = W_n - \delta X_n$$

$$T_{n+1} = T_n + \delta, \text{ where } 0 < \delta < 2$$

if $W_n \cdot X_n \geq T_n$ and the category is 1, or
if $W_n \cdot X_n < T_n$ and the category is 0, then $$W_{n+1} = W_n$$

$$T_{n+1} = T_n.$$

13. An apparatus for performing error correction on an incoming stream of data, the apparatus having:
- a plurality of weights W comprising W1 through Wn a first decision function having a decision processor accepting said incoming stream of data and forming a sum from multiplying a subset of adjacent said data by said weight W, thereby forming a summer output and forming a decision by comparing said summer output with a first decision history input;
- a first decision history function generating said decision history input by furnishing a plurality of previous decisions from said first decision function to the address input of a look-up-table, and providing the associated data as said first decision history input;
- a second decision function having a decision processor accepting a time-reversed said incoming stream of data and forming a sum from multiplying a subset of adjacent said data by position-reversed said weight W, thereby forming a second decision function summer output and forming a decision by comparing said summer output with a second decision history input;
- a second decision history function generating said second decision history input by furnishing a plurality of previous decisions reversed in time from said first decision function to the address input of a look-up-table, and providing the associated data as said second decision history input;
- a third decision function having a decision processor comprising a threshold detector receiving said second decision processor summer output and comparing it with a third decision history input;
- a third decision history function generating said third decision history input by furnishing a plurality of previous decisions from said third decision function to the address input of a look-up-table, and providing the associated data as said second decision history input;
- a forward parity check operating on the output of said first decision processor;
- a first reverse parity check operating on the output of said second decision processor;
- a second reverse parity check operating on the output of said third decision processor;
- error correction logic operating on said first decision function output, said second decision function output, said third decision function output, said forward parity check, said first reverse parity check, and said second reverse parity check, thereby producing an error corrected output.

14. The TLU of claim 13 where at least one of said look-up tables contains values conditioned from previous said decisions.

15. The TLU of claim 13 where at least one of said look-up tables contains values formed from an optimum decision surface derived from a plurality of vectors forming a training set, said vectors formed in clusters according to the following procedure:
 a) trimming said vectors from said clusters where said vectors are determined to cause said clusters to overlap;
 b) translating the $X_n$ vector coordinates by subtracting the mean value $\overline{X}$ of all vectors in said training set;
 c) adapting said weights W by removing said vectors that cause said weights to not converge and repeating said adaptation with the reduced training vector set;
 d) converting said vector W to a unit vector;
 e) adjusting each dimension of said unit vector until optimum separation between clusters is achieved.

16. The TLU of claim 15 where said optimum separation is accomplished by incrementally applying an amount δ as follows:
 incrementing said unit vector by $\delta u_i$ until a new surface intersects any said cluster as determined by testing $W_n \cdot X_n$ to determine whether the result is a 1 or a 0, thereby indicating said intersection;
 changing a direction of rotation by negating said δ, dividing said δ by 2, and continuing to increment said vector by said δ/2 until the resultant surface no longer intersects a cluster, thereby forming a final vector.

17. The TLU of claim 16 where said optimum separation is further accomplished by saving said final vector as $D_{max}$, repeating said optimum separation process starting with original said vectors and changing the sign of the original δ to produce a final TLU vector $D_{min}$ and using the mean of $D_{max}$ and $D_{min}$ as said final vector.

18. The TLU of claim 13 where the category of $X_n$ is the value of the $n_{th}$ bit, and said weights are formed from:

if $W_n \cdot X_n \geq T_n$ and the category is 0 then $$W_{n+1} = W_n + \delta X_n$$

$$T_{n+1} = T_n - \delta$$

if $W_n \cdot X_n < T_n$ and the category is 1 then $$W_{n+1} = W_n - \delta X_n$$

$$T_{n+1} = T_n + \delta, \text{ where } 0 < \delta < 2$$

if $W_n \cdot X_n \geq T_n$ and the category is 1, or
if $W_n \cdot X_n < T_n$ and the category is 0, then $$W_{n+1} = W_n$$

$$T_{n+1} = T_n.$$

\* \* \* \* \*

UNITED STATES PATENT AND TRADEMARK OFFICE
CERTIFICATE OF CORRECTION

PATENT NO. : 7,530,004 B1
APPLICATION NO. : 11/406653
DATED : May 5, 2009
INVENTOR(S) : Charles Sinclair Weaver, Constance Dell Chittenden and A. Brit Conner It is certified that error appears in the above-identified patent and that said Letters Patent is hereby corrected as shown below:

Column 5, line 27 "$y_n = W \bullet (X_n - \overline{Y})$" should be changed to --$y_n = W \bullet (X_n - \overline{X})$--

Column 5, line 39 "amount 6 as" should be changed to --amount $\delta$ as--

Signed and Sealed this

Eighth Day of September, 2009

David J. Kappos
*Director of the United States Patent and Trademark Office*